US008841549B2

(12) United States Patent
Vardeny et al.

(10) Patent No.: US 8,841,549 B2
(45) Date of Patent: Sep. 23, 2014

(54) ORGANIC SPINTRONIC DEVICES AND METHODS FOR MAKING THE SAME

(75) Inventors: Zee valentine Vardeny, Salt Lake City, UT (US); Alex Ndobe, Ottawa (CA)

(73) Assignee: University of Utah Research Foundation, Salt Lake City, UT (US)

( * ) Notice: Subject to any disclaimer, the term of this patent is extended or adjusted under 35 U.S.C. 154(b) by 520 days.

(21) Appl. No.: 13/123,493

(22) PCT Filed: Sep. 28, 2009

(86) PCT No.: PCT/US2009/058657
§ 371 (c)(1),
(2), (4) Date: Aug. 11, 2011

(87) PCT Pub. No.: WO2010/042344
PCT Pub. Date: Apr. 15, 2010

(65) Prior Publication Data
US 2013/0199601 A1    Aug. 8, 2013

Related U.S. Application Data

(60) Provisional application No. 61/103,817, filed on Oct. 8, 2008.

(51) Int. Cl.
*B82Y 10/00* (2011.01)
*H01L 51/42* (2006.01)
*H01L 51/00* (2006.01)

(52) U.S. Cl.
CPC .............. *H01L 51/424* (2013.01); *B82Y 10/00* (2013.01); *H01L 51/0036* (2013.01); *H01L 51/4253* (2013.01); *H01L 51/004* (2013.01); *Y02E 10/549* (2013.01); *H01L 51/005* (2013.01); *H01L 51/0047* (2013.01); *H01L 51/0037* (2013.01)
USPC ................ 136/263; 136/255; 257/40; 438/99

(58) Field of Classification Search
USPC .......................................................... 136/263
See application file for complete search history.

(56) References Cited

U.S. PATENT DOCUMENTS

| 6,621,100 B2 | 9/2003 | Epstein et al. |
| 2003/0062080 A1 | 4/2003 | Satoh et al. |
| 2005/0029610 A1 | 2/2005 | Nishikitani et al. |

(Continued)

OTHER PUBLICATIONS

Yasunori Yonekuta, "Radical polymers and their application to organic memory devices", (Jul. 2007), A thesis presented to Waseda University, pp. 1-85, [Online], [Retrieved on Jul. 11, 2013], Retrieved from the internet:<URL: http://dspace.wul.waseda.ac.jp/dspace/bitstream/2065/28723/3/Honbun-4596.pdf>.*

(Continued)

*Primary Examiner* — Jeffrey T Barton
*Assistant Examiner* — Tae-Sik Kang
(74) *Attorney, Agent, or Firm* — Thorpe North & Western LLP

(57) ABSTRACT

An organic spintronic photovoltaic device (100) having an organic electron active layer (102) functionally associated with a pair of electrodes (104, 106). The organic electron active layer (102) can include a spin active molecular radical distributed in the active layer (102) which increases spin-lattice relaxation rates within the active layer (102). The increased spin lattice relaxation rate can also influence the efficiency of OLED and charge mobility in FET devices.

14 Claims, 6 Drawing Sheets

(56) References Cited

U.S. PATENT DOCUMENTS

| | | |
|---|---|---|
| 2005/0079277 A1 | 4/2005 | Takashima et al. |
| 2005/0098207 A1 | 5/2005 | Matsumoto et al. |
| 2006/0008740 A1 | 1/2006 | Kido et al. |
| 2006/0292736 A1 | 12/2006 | Lee et al. |
| 2008/0115833 A1 | 5/2008 | Carlson |

OTHER PUBLICATIONS

Boucle et al., "Hybrid polymer—metal oxide thin films for photovoltaic applications", Journal of Material Chemistry, vol. 17, (2007), pp. 3141-3153.*

Zhang et al., "The 2,2,6,6-Tetramethyl-1-piperidinyloxy Radical: An Efficient, Iodine-Free Redox Mediator for Dye-Sensitized Solar Cells", Advanced Functional Materials, vol. 18, (2008), pp. 341-346.*

Ito et al., "Fabrication of thin film dye sensitized solar cells with solar to electric power conversion efficiency over 10%", Thin Solid Films, vol. 516, (2008), pp. 4613-4619.*

Gilot et al., "The use of ZnO as optical spacer in polymer solar cells: Theoretical and experimental study", Applied Physics Letters, vol. 91, (2007), pp. 113520-1-113520-3.*

Vaddiraju et al., "Radical Salt-Doped Hole Transporters in Organic Photovoltaic Devices", Chem. Mater., 2007 (19), 4049-4055.*

Yang et al.; Poaron Spine-Lattice Relaxation Time in—Conjugated Polymers from Optically Detected Magnetic Resonance; Physical Review Letters; Oct. 9, 2007; pp. 1-4.

Alberty et al.; Magnetic Resonance Spectroscopy, Ch. 16; 1992; 30 pages.

Du Pasquier et al.; On the Use of Ga-In Euterctic and Hologen Light Source for Testing P3HT-PCBM organic Solar Cells; Solar Energy Materials and Solar Cells; 2006; pp. 1828-1839; vol. 90.

Berson et al.; Elaboration of P3HT/CNT/PCBM Composites for Organic Photovoltaic Cells; Advanced Functional Materials; 2007; pp. 3363-3365; vol. 17.

Ishihara et al.; The Effect of Annealing of Organic Thin Films on Charge Injection in Organic Electroluminescent Devices; Journal of Photopolymer Science and Technology; 2002; p. 769-774 vol. 15; No. 5.

PCT Application PCT/US2009/058657; filed Sep. 28, 2009; Zee Valentine Vardeny; ISR mailed May 18, 2010.

PCT/US2012/026365; filed Feb. 23, 2012; University of Utah Research Foundation et al.; international search report dated Oct. 30, 2012.

WJM Naber et al., "Organic spintronics", J.Phys.D: Appl. Phys.; vol. 40, pp. R20; 5-R228;Jun. 4, 2007; pp. R209-R215.

J.M. Lupton et al.; "Coherent spin manipulation in molecular semiconductors: Getting a handle on organic spontornics"; ChemPhysChem, vol. 11, pp. 3040-3058; Jul. 2, 2010.

* cited by examiner

ORGANIC SPINTRONIC DEVICES AND METHODS FOR MAKING THE SAME

RELATED APPLICATIONS

Priority of U.S. Provisional Patent Application Ser. No. 61/103,817 filed on Oct. 8, 2008 is claimed.

GOVERNMENT INTEREST

This invention was made with government support under Department of Energy Grant No. 04-ER 46109 and National Science Foundation Grant Nos. 05-03172 and 08-03172. The United States government has certain rights in this invention.

FIELD OF THE INVENTION

This invention relates to electronic devices based on organic semiconducting materials. More specifically, the invention covers organic spintronic photovoltaic devices having unique organic compositional features. Therefore, the present invention relates generally to the fields of electrical engineering, quantum physics, chemistry, materials science, spintronics, and photovoltaic applications.

BACKGROUND

Conventional energy sources such as coal, oil, natural gas, and uranium, represent a finite resource and furthermore result in adverse consequences in terms of environmental damage and/or risk of damage. Despite some improvements in pollution control and safety protocols, none of these energy sources satisfactorily eliminates environmental concerns. In contrast, renewable energy sources are never exhausted and often more controllable effects or little effect on the environment. Common renewable energy harnessing technologies include photovoltaic systems, solar thermal applications, wind mills, wind energy electricity generators, micro-hydro power plants, biomass/biogas plants, geothermal, wave and tidal plants, and their associated energy storage components. Each of these technologies currently has economic, practical, and/or technical hurdles which prevent their widespread use. Photovoltaic electricity generation has the singular advantage of being modular and not limited to geographic location. For this reason, decentralized electricity generation, and systems of different sizes are possible. The conversion of solar radiation into electrical energy by means of solar cells has been successfully implemented as a part of satellite and space travel technology. Other applications for solar cells such as charging batteries, powering watches, calculators and other devices has also seen modest commercial success.

The theoretical efficiency of solar cells is about 30%, and in practice, efficiencies as high as 25% have been achieved with silicon photovoltaic laboratory devices. Overall system efficiencies of commercial devices are in the range of 10 to 14%. The technology of photovoltaic devices is well developed, but large scale application is hampered by the high price of the cells. The widespread use of solar power has been elusive because it can be difficult and costly to manufacture commercial photovoltaic cells, which are made of inorganic crystals such as silicon.

One alternative to circumvent this problem is to develop photovoltaic cells from materials that can be processed as easily as plastics. Organic solar cells have an advantage over their inorganic counterparts, in that they are much less expensive to produce. They do not require the high deposition temperatures or complex processing as required for inorganic devices, and they can be deposited onto large flexible substrates. For example, organic cells can be made in different colors and be flexible enough to use on window blinds, walls, and other materials in buildings. This provides design options that could lower the cost of using the cells. Unfortunately, poor energy conversion efficiencies have thus far prevented organic-based devices from being successfully commercialized. The last few years have seen a tremendous progress in the application of organic materials for photovoltaic following the success of this class of materials in other electrical, electronic and opto-electrical applications. However, none of the existing techniques provides sufficient improvements in efficiencies and reduced manufacturing costs.

SUMMARY OF THE INVENTION

In light of the problems and deficiencies noted above, an organic spintronic photovoltaic device with an organic electron active layer functionally associated with a pair of electrodes has been developed. The organic electron active layer can include a spin active molecular radical distributed in the active layer which increases spin-lattice relaxation rates within the active layer. The organic electron active layer can be configured in a wide variety of designs, depending on the particular device. For example, photovoltaic device design can include, bulk heterojunction, planar heterojunction, dye sensitized, or other newer or exotic configurations. The pair of electrodes is functionally associated with the organic electron active layer to complete a circuit which transfers electrons via the organic electron active layer. The increase spin lattice relaxation rate can also influence the efficiency of OLED and charge mobility in FET devices.

In one aspect, the organic spintronic device is an organic photovoltaic. Organic photovoltaic embodiments can be a bulk heterojunction design including a donor material blended with an acceptor material with the spin active molecular radical distributed therein. Alternatively, the organic electron active layer can be a dye sensitized layer including an electron donor dye, an electron acceptor phase, and a redox coupling electrolyte. In yet another alternative, the organic electron active layer can be a bi-layer or planar heterojunction including an organic donor layer adjacent to an organic acceptor layer. In this case the spin active molecular radical can be distributed primarily in the organic acceptor layer, although it can also be present in the donor layer to achieve similar decreases in spin-lattice relaxation times.

Although other spin active molecular radicals may be used, one embodiment can utilize ½ spin molecular radicals. Suitable spin active radicals can include those that also exhibit reduced aggregation and dispersibility in a host matrix. In one specific embodiment, the spin active molecular radical can be TEMPO or TOPO.

A method of forming an organic spintronic device can generally include preparing a first electrode layer. The organic electron active layer can be formed on the first electrode layer. A second electrode layer can then be formed on the organic electron active layer. Although manufacturing techniques can vary such sequential processing is typical.

There has thus been outlined, rather broadly, the more important features so that the detailed description thereof that follows may be better understood, and so that the present contribution to the art may be better appreciated. Other features will become clearer from the following detailed description, taken with the accompanying drawings and claims, or may be learned by the practice of these concepts.

BRIEF DESCRIPTION OF THE DRAWINGS

The present disclosure will become more fully apparent from the following description and appended claims, taken in conjunction with the accompanying drawings. Understanding that these drawings merely depict exemplary embodiments and they are, therefore, not to be considered limiting of its scope. It will be readily appreciated that the components, as generally described and illustrated in the figures herein, could be arranged, sized, and designed in a wide variety of different configurations. Nonetheless, these concepts will be described and explained with additional specificity and detail through the use of the accompanying drawings in which:

DETAILED DESCRIPTION OF EXEMPLARY EMBODIMENTS

Figure 1:
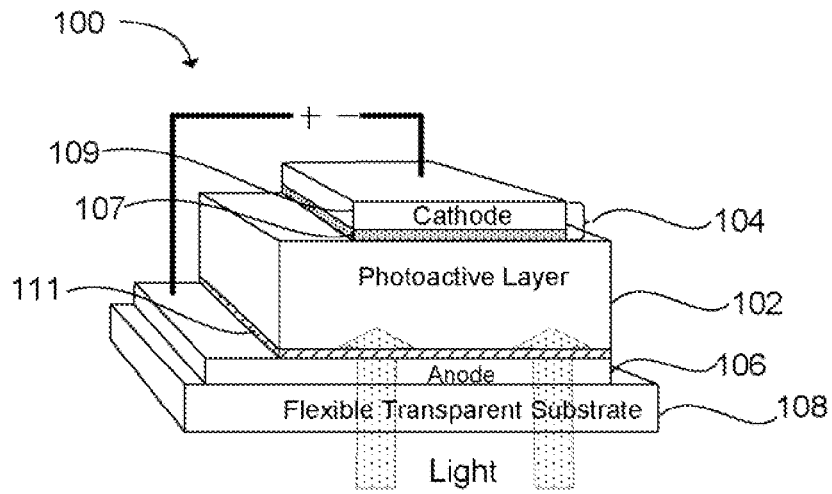
FIG. 1 is a general schematic of organic solar cells in accordance with one embodiment.

The following detailed description of exemplary embodiments of the invention makes reference to the accompanying drawings, which form a part hereof and in which are shown, by way of illustration, exemplary embodiments in which the invention may be practiced. While these exemplary embodiments are described in sufficient detail to enable those skilled in the art to practice the invention, it should be understood that other embodiments may be realized and that various changes to the invention may be made without departing from the spirit and scope of the present invention. Thus, the following more detailed description of the embodiments of the present invention is not intended to limit the scope of the invention, as claimed, but is presented for purposes of illustration only and not limitation to describe the features and characteristics of the present invention, to set forth the best mode of operation of the invention, and to sufficiently enable one skilled in the art to practice the invention. Accordingly, the scope of the present invention is to be defined solely by the appended claims.

The following detailed description and exemplary embodiments of the invention will be best understood by reference to the accompanying drawings, wherein the elements and features of the invention are designated by numerals throughout.

DEFINITIONS

In describing and claiming the present invention, the following terminology will be used.

The singular forms "a," "an," and "the" include plural referents unless the context clearly dictates otherwise. Thus, for example, reference to "a layer" includes reference to one or more of such structures and reference to "coating" refers to one or more such steps.

As used herein, "electron active" refers to a material which produces and/or absorbs electrons upon input of sufficient energy. For example, an electron active layer is one which can produce electrons (and corresponding holes) which are desirably transported to an anode to produce electric current.

As used herein, "radical" refers to a compound which has at least one unpaired electron. A radical may also carry an electric charge (i.e. a radical ion) but ions are not always "radicals." This usage is consistent with published IUPAC recommendation definitions for physical organic chemistry, Pure & Applied Chem., vol. 66, No. 5, pp. 1155-1156 (1994).

As used herein, "transparent" refers to sufficient light transmission to achieve desired efficiencies. The transparent substrate should thus generally not be a limiting factor in possible efficiencies. Thus, although some diffusion or hazing (e.g. translucence) is allowable this is generally limited to prevent excessive loss of photons impacting the organic electron active layer.

As used herein with respect to an identified property or circumstance, "substantially" refers to a degree of deviation that is sufficiently small so as to not measurably detract from the identified property or circumstance. The exact degree of deviation allowable may in some cases depend on the specific context.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of about 1 to about 4.5 should be interpreted to include not only the explicitly recited limits of 1 to about 4.5, but also to include individual numerals such as 2, 3, 4, and sub-ranges such as 1 to 3, 2 to 4, etc. The same principle applies to ranges reciting only one numerical value, such as "less than about 4.5," which should be interpreted to include all of the above-recited values and ranges. Further, such an interpretation should apply regardless of the breadth of the range or the characteristic being described.

In the present disclosure, the term "preferably" or "preferred" is non-exclusive where it is intended to mean "preferably, but not limited to." Any steps recited in any method or process claims may be executed in any order and are not limited to the order presented in the claims. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the invention should be determined solely by the appended claims and their legal equivalents, rather than by the descriptions and examples given herein.

EMBODIMENTS OF THE INVENTION

π-conjugated polymers (PCPs) have shown significant promise for potential applications such as organic light-emitting devices, organic field-effect transistors, and organic photovoltaic (OPV) devices (a.k.a. organic solar cells). The best power conversion efficiency of >5% is achieved in OPV devices that employ a bulk heterojunction structure. In a bulk heterojunction device architecture, a solvent-cast layer of PCP/fullerene blend is sandwiched between a cathode and an anode. Electron- and hole-transport layers are often inserted at the cathode and anode sides of the device, respectively, to improve charge collection.

PCPs absorb in the UV-visible part of the solar spectrum, and this compensates the relative optical transparency of fullerene and fullerene-derivative molecules in this energy range. Upon photoexcitation of PCPs, excitons (tightly bound intrachain electron-hole pairs) are usually formed. Dissociation of the photogenerated excitons is facilitated by energy differences between a donor material (the PCP) and an acceptor material (the fullerene). Initially each exciton separates into a loosely-bound polaron pair (PP), an intermediate species that exists at the donor/acceptor interface. Subsequently some of the PP species separate into "free" electrons and holes that are available for transport. In the blend, the PCP acts as electron donor and hole transporter, whereas the fullerene derivative is an electron acceptor and hole transporter. Thus, the photogenerated holes and electrons can be readily collected at the anode and cathode, respectively. However, if recombination of either the exciton or polaron pair occurs prior to dissociation, there is no contribution to the photocurrent, and the photon is wasted.

Atomic force microscopy (AFM) and Resonance Raman spectroscopy studies have shown that phase-separated domains of aggregated PCP and fullerene molecules are formed in the blend, especially after the film undergoes an annealing process at elevated temperature. The domain size of these aggregates is ideally on the scale of the exciton diffusion length, which enables excitons to reach the donor/acceptor interface before recombination occurs. Crystallization of both PCP and fullerene phases have also been observed in these domains, which leads to improved charge mobility. In accordance with one embodiment, a PCP/fullerene blend comprised of regio-regular poly(3-hexylthiophene) [or RR-P3HT] and fullerene derivative 1-[3-(methoxycarbonyl)propyl]-1-1-phenyl)[6,6]$C_{61}$ [or PCBM] is disclosed.

Since the polaronic charge carriers in OPV devices carry a spin ½, then adding spin ½ free radicals into bulk heterojunction OPV devices can manipulate the charge dissociation/recombination/transport rates, and consequently influence the device performance. In one embodiment, the free radical used in the bulk heterojunction is galvinoxyl, which is a conjugated molecule with $C_2$ symmetry. The $C_2$ symmetry allows the unpaired electron in galvinoxyl to delocalize along the conjugated molecule. The delocalization of the unpaired electron enhances the possibility of spin-spin interaction across the molecule. Adding a few percent (by weight) of the radicals improves the device performance. It is assumed that the improved device performance results from spin-spin interactions of the radical impurities with the photogenerated electrons and holes in the device. The technique of optically detected magnetic resonance (ODMR), which is sensitive to spin lattice relaxation rates, is used to verify this hypothesis.

An organic spintronic device with an organic electron active layer functionally associated with a pair of electrodes can be used. For example, FIG. 1 illustrates one embodiment of an organic solar cell 100 in accordance with an embodiment of the present invention. The organic electron active layer 102 can include a spin active molecular radical distributed in the active layer which increases spin-lattice relaxation rates within the active layer. The organic electron active layer can be configured in a wide variety of designs, depending on the particular device. For example, photovoltaic device design can include, bulk heterojunction, planar heterojunction, dye sensitized, or other newer or exotic configurations. Other suitable devices can include, but are not limited to, photodiodes, organic light emitting diodes, field effect transistors (FETs) and light FETs, as well as organic spin valves. The organic solar cell 100 can include a first electrode 104 and a second electrode 106. At least one of the first and second electrodes can be comprised of a material that is substantially transparent to a desired wavelength of light. The organic solar cell can be formed on a flexible transparent substrate 108. The electrodes are functionally associated with the organic electron active layer to complete a circuit which transfers electrons via the organic electron active layer.

In one aspect of the present invention, the organic spintronic device is an organic photovoltaic. Organic photovoltaic embodiments can be a bulk heterojunction design including a donor material blended with an acceptor material with the spin active molecular radical distributed therein. Alternatively, the organic electron active layer can be a dye sensitized layer including an electron donor dye, an electron acceptor phase, and a redox coupling electrolyte. In this case the spin active molecular radical can be distributed primarily in the electron acceptor phase. In yet another alternative, the organic electron active layer can be a bi-layer or planar heterojunction including an organic donor layer adjacent to an organic acceptor layer. In this case the spin active molecular radical can be distributed primarily in the organic acceptor layer, although it can also be present in the donor layer to achieve similar decreases in spin-lattice relaxation times.

Although other spin active molecular radicals may be used, one embodiment of the present invention can utilize ½ spin molecular radicals. Suitable spin active radicals can include those that also exhibit reduced aggregation and dispersibility in a host matrix. Furthermore, spin active molecular radicals can be non-polymeric. Non-limiting examples of suitable spin active molecular radicals can include:

TEMPO (2,2,6,6-Tetramethylpiperidine 1-oxyl)

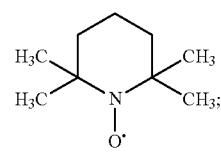

4-Amino-TEMPO

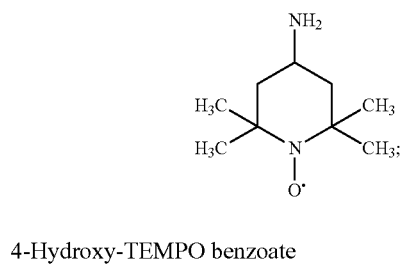

4-Hydroxy-TEMPO benzoate

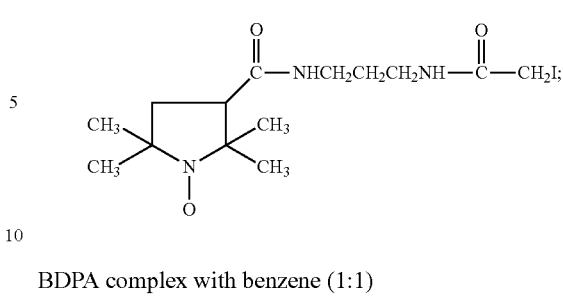

BDPA complex with benzene (1:1)

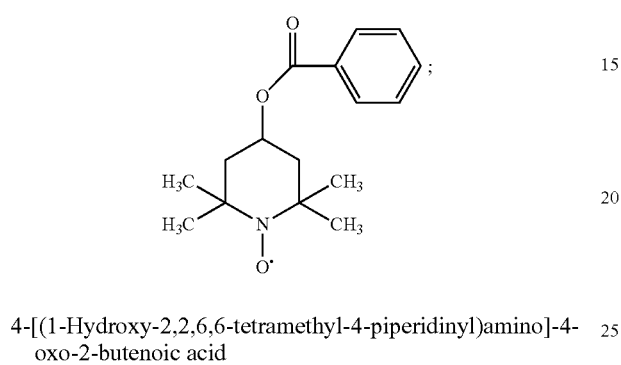

4-[(1-Hydroxy-2,2,6,6-tetramethyl-4-piperidinyl)amino]-4-oxo-2-butenoic acid

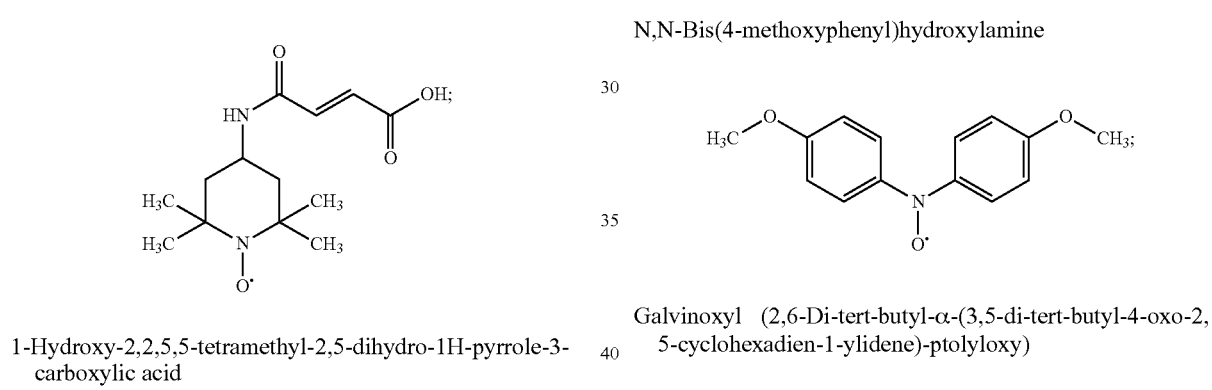

N,N-Bis(4-methoxyphenyl)hydroxylamine

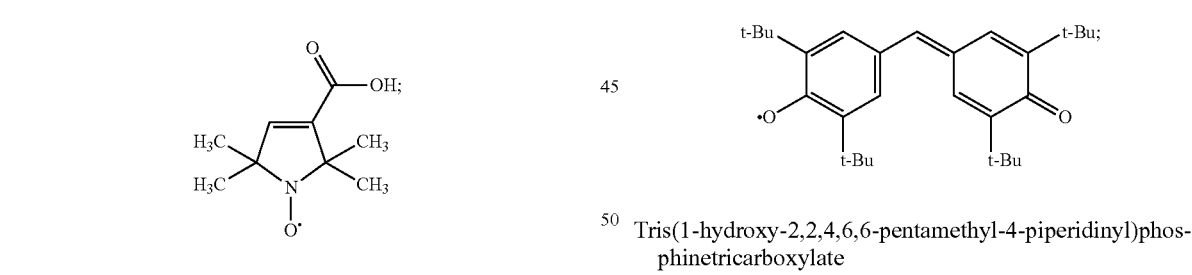

1-Hydroxy-2,2,5,5-tetramethyl-2,5-dihydro-1H-pyrrole-3-carboxylic acid

Galvinoxyl (2,6-Di-tert-butyl-α-(3,5-di-tert-butyl-4-oxo-2,5-cyclohexadien-1-ylidene)-ptolyloxy)

4-Phenyl-2,2,5,5-tetramethyl-3-imidazolin-1-yloxy

Tris(1-hydroxy-2,2,4,6,6-pentamethyl-4-piperidinyl)phosphinetricarboxylate

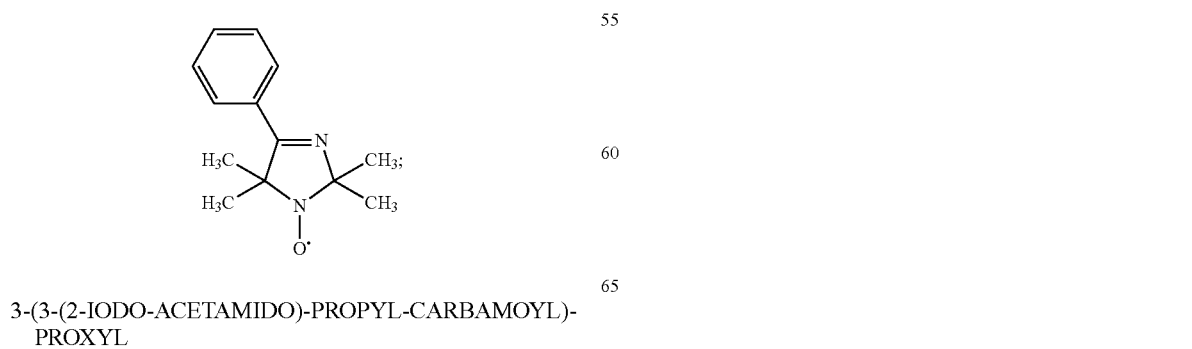

3-(3-(2-IODO-ACETAMIDO)-PROPYL-CARBAMOYL)-PROXYL

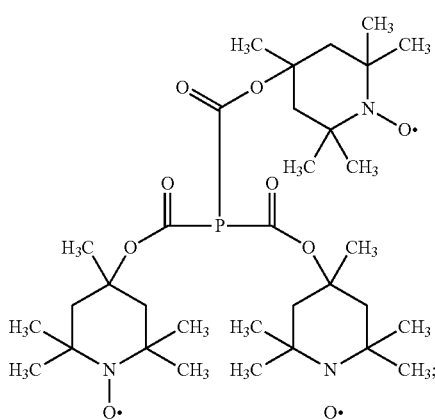

Bis(1-hydroxy-2,2,4,6,6-pentamethyl-4-piperidinyl)oxalate

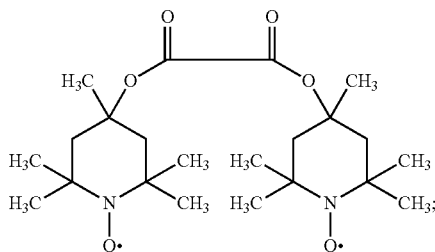

Trioctylphosphine oxide (TOPO);
M@C60-xx, where M is Gd-157 (a stable 3/2 spin nanoparticle); and combinations of these radicals.

Another type of 'radical' material may be a material having spin active molecular radicals comprised of ferromagnetic nanoparticles that have spontaneous spin alignment properties. In one specific embodiment of the present invention, the spin active molecular radical can be TEMPO or TOPO. The actual amount of spin active molecular radical in the organic electron active layer can vary depending on the specific materials and device configuration. However, as a general guideline, the spin active molecular radical can be present from 0.1 wt % to about 10 wt % of the active layer, and often from about 1 wt % to about 7 wt %. When the spin active molecular radical is TEMPO the same can be present at about 5 wt % of the active layer.

In one aspect of the present invention, the organic electron active layer can comprise a donor polymer and an acceptor molecule. Non-limiting examples of suitable donor polymers can include 2-methoxy-5-(2'-ethylhexyloxy) phenylene vinylene polymer (MEHPPV), 1,4-bis[(4-styryl)styryl]-2-methoxy-5-(2'-ethylhexoxy)benzene polymer, poly(2-methoxy,5-(3',7'-dimethyloctyloxy)-1,4-phenylenevinylene (MDMOPPV), poly(2,5-(2-ethylhexyloxy)-1,4-phenylenevinylene) (BEHPPV), regio regular poly(3-hexylthiophene), other polythiophenes or polyphenylenevinylenes, and combinations of these polymers. Regioregular poly(3-hexylthiophene) can be useful as it has good hole mobility and light absorption for wavelengths of light up to about 650 nm. The blend of P3HT/PCBM can extend the wavelength to about 1 micrometer.

Similarly, the acceptor molecule can be any suitable molecule which can accept electrons. Non-limiting examples of acceptor molecules can include fullerene C60, 6-1-(3-(methoxycarbonyl)(propyl)-5-1-phenyl-[6,6]-C61 (PCBM, a soluble C60), $TiO_2$, other modified fullerenes such as C70, C84, and their soluble versions and Di-PCBM. PCBM is unique in that it can accept up to 6 electrons and also has high electron mobility and a HOMO and LUMO of 6.1 eV and 3.7 eV, respectively.

Further, various additives can be incorporated into one or more of the layers. For example, plasticizers can be added to increase flexibility and/or colorants can be added to adjust appearance. Non-limiting examples of suitable plasticizers can include propylene carbonate, gamma-butyrolactone, ethylene carbonate, dimethylsulfoxide, acetonitrile, sulfolane, dioxolane, dimethylformamide, tetrahydrofuran, adiponitrile, methyl pyrrolidinone, and the like.

The pair of electrodes 104, 106 can include any conductive material which does not inhibit performance of the device. For solar cells, transparent conductive materials can be preferred for at least one of the electrodes. Indium tin oxide can be particularly suitable and is commonly used for electronic devices. However, other transparent conductive materials can be used such as, but not limited to, thin metal oxides, doped oxides, conductive diamond, indium zinc oxide, bathocuproine-Cs, and the like. Other conductive materials can also be used for the cathode 104 such as, but not limited to, conductive metals such as silver, copper, gold, aluminum, magnesium, conductive polymers, and the like.

In one optional embodiment, the cathode 104 can further include a conductive layer 109 and an electron transport layer 107, where the electron transport layer 107 is oriented between the organic electron active layer 102 and the conductive metal layer 109. An optional hole transport layer 111 can be formed adjacent the organic electron active layer 102 between the anode 106 and the active layer 102. This layer 111 can facilitate hole transport as well as block electrons from recombination at the interface with the anode 106. Suitable materials for the hole transport layer 111 can include, but are not limited to, poly(3,4-ethylenedioxythiophene) poly(styrene sulfonate) (a high conductivity transparent PEDOT:PSS which is commercially available as Baytron P® from H.C. Stark), or other hole transport layer materials available at Plextronics such as Plexcore® OC. For photovoltaic materials, the hole transport layer 111 can preferably be transparent in order to allow photons to reach the active layer 102. Although specific designs can vary, as a general guideline, the hole transport layer 111 can have a thickness from about 50 to about 100 nm.

Depending on the specific design, the organic spintronic devices of the present invention can exhibit an increased current of at least 10% over a device having the same structure and components as the organic spintronic device without the spin active molecular radical. In some embodiments, the increased current over those without spin active molecular radicals can be from 20% to 50%.

Figure 2:
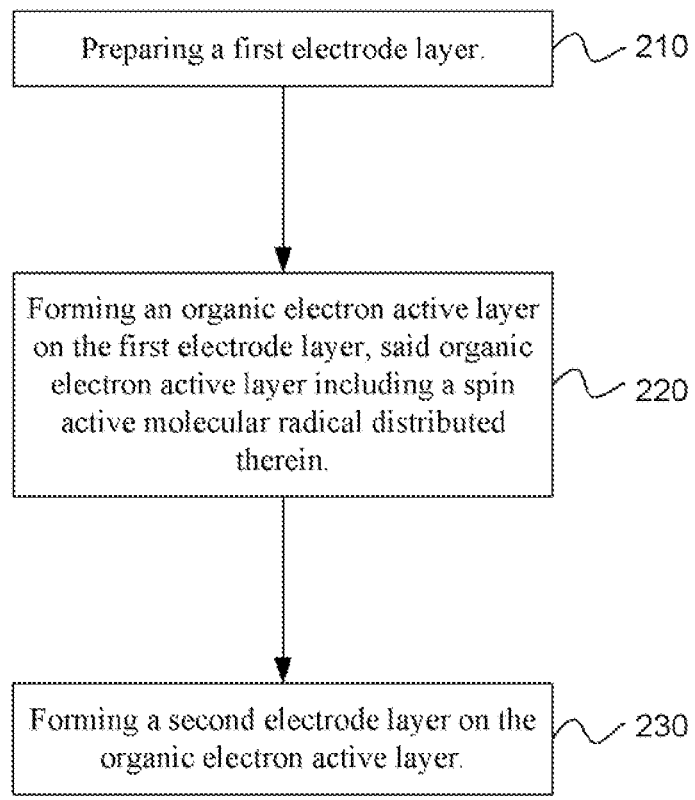
FIG. 2 is a flow chart depicting a method of forming an organic spintronic device in accordance with an embodiment.

In accordance with another embodiment of the present invention, a method 200 of forming an organic spintronic device is disclosed, as depicted in the flow chart of FIG. 2. The method can generally include preparing 210 a first electrode layer. The organic electron active layer can be formed 220 on the first electrode layer. The organic electron active layer can include a spin active molecular radical distributed therein. A second electrode layer can then be formed 230 on the organic electron active layer. Although manufacturing techniques can vary, such sequential processing is typical.

In the case of solar cells or other photovoltaic devices, the first electrode layer can include a transparent substrate with a transparent conductive layer thereon. Suitable transparent substrates can include glass (colored or clear), transparent resins such as, but not limited to, polyesters, polycarbonates, polyimides, polysulfones, polystyrenes, cellulosic acetates, polyamides, and the like. Any material which is substantially transparent at the desired wavelength and can be formed to provide a mechanical protective barrier can be suitable.

The particular manufacturing method used to form the organic solar cell 100 can vary depending on the device design. However, in one embodiment, the organic electron active layer 102 can be formed by coating the first electrode layer with a donor polymer, an acceptor molecule, and the spin active molecular radical. This can include preparing a substantially homogeneous mixture of the donor polymer, the acceptor molecule, and the spin active molecular radical. Alternatively, distinct layers can be coated or deposited for each of the donor polymer and the acceptor molecule. Generally, the coating can be a solution-based process such as spin casting, drop casting, dipping, bar coating, screen printing, or the like. A suitable solvent can be used such as toluene, tetrahydrofuran, chloroform, chlorobenzene, ortho-dichlorobenzene, and the like, which is then evaporated or otherwise removed. The choice of solvent can affect coating properties, e.g. polarity, vaporization rates, etc. Alternatively, the coating can be performed using deposition processes such as vacuum deposition, chemical vapor deposition, sputtering, molecular beam epitaxy, atomic layer deposition, ion plating, and the like. Again, the specific dimensions can vary depending on the materials and specific device design. However, the organic electron active layer 102 can typically have a thickness from about 80 to about 120 nm.

An electron transport layer 107 can be formed as part of the second electrode adjacent the organic electron active layer. The electron transport layer 107 can be any material which facilitates electron mobility from the organic electron active layer to the cathode 104. Non-limiting examples of suitable materials for the electron transport layer 107 include calcium, lithium fluoride, carbon nanotubes, n-type ZnS, Alq3 and other such small molecules, or other low work function materials. A conductive cathode layer 109 can then be deposited on the electron transport layer 107. The cathode can be any suitable conductive material as previously described. The cathode can act as both a conductive electrode, as well as mechanical protection and/or reflect light back through the organic electron active layer. Non-limiting examples of suitable cathode materials can include gold, aluminum, silver, platinum, or the like. Generally, the cathode layer 104 can be thicker than other layers, e.g. several hundred nanometers.

At each interface between adjacent layers, surface roughness can influence carrier injection, electron/hole mobilities, and ultimately the device performance. Thus, surfaces can be polished prior to depositing a material thereon. However, some materials provide inherently smooth coating properties, e.g. PEDOT:PSS, etc., such that no additional polishing is required. Similarly, impurities and debris can be likewise harmful to effective transport of charge across interfaces. Therefore, surfaces can be cleaned, e.g. solvent washing, plasma treatment, or the like.

One or more of the layers, e.g. active layer, electrode layers, etc. can be additionally treated by annealing or baking. Annealing can be performed by exposing deposited films to an inert gas (e.g. nitrogen, argon, etc.) or vacuum at elevated temperatures (or room temperature vapor annealing). Specific annealing conditions can vary but are generally well below melting points of the materials for relatively short period of time, e.g. from about 50° C. to about 120° C. and from 5 to 30 minutes. Multi-stage annealing, e.g. a first lower temperature followed by a second higher temperature, can also be used. Annealing can effectively eliminate solvent, water, and/or other undesirable or unintentional impurities. Further, annealing can allow for molecules to realign so as to improve film nanomorphology, e.g. enhancing interchain interaction and increase charge polaron photogeneration. Baking offers similar benefits and conditions and generally refers to a comparable heating process for longer times, e.g. 1-2 hours.

The organic spintronic device can be optionally encapsulated with a UV curable material subsequent to forming the second electrode. This can provide protection for mechanical, chemical and/or environmental damage. Non-limiting examples of suitable encapsulating material can include silicon oxynitride, epoxies, and the like.

EXAMPLES

Without being bound to any particular theory, one of the main contributing factors to the low efficiency appears to be the low output current due to the high carrier recombination rate and low carrier mobility. In bulk heterojunction organic photovoltaics, the accepted mechanism for current production is the following: First, upon illumination, there is exciton generation in the blend, followed by a migration of the exciton to the donor-acceptor interface where, either because of the existence of a build in potential or the dipole interaction between the donor and the acceptor, this exciton is separated into a free electron in the acceptor material and a hole in the donor material. From this point, the electron and hole migrate to the cathode and the anode, respectively. For efficient device performance, one has an exciton diffusion length that is larger than the average donor or acceptor aggregate size to minimize exciton recombination. For efficient exciton separation the exciton binding energy can also be smaller than the dipole-dipole interaction between the donor and the acceptor or the built in voltage. A relatively high and substantially equal level of electron and hole mobility allows for better carrier collection. An ohmic contact between the organic constituents and the electrodes can be formed to increase performance. Geminate recombination of polaron pairs in the spin singlet configuration can be substantially reduced by addition of the spin active molecular radicals of the present invention. In particular, the spin active molecular radical can induce spin flip in the spin ½ electron or hole to result in a spin triplet state, which has a longer diffusion length. As a result, spin-lattice relaxation rate increases, decreasing spin relaxation time, increasing photocurrent, and increasing carrier mobilities by reducing losses to geminate recombination. Thus, not only is there a resulting increase in short circuit current density, but also an increase in the device fill-factor (FF). Additional technical and theoretical background for these affects can be found in *Polaron Spin-Lattice Relaxation Time in π-Conjugated Polymers from Optically Detected Magnetic Resonance*, Yang et al., Phys. Rev. Lett. 99 (15), 157401 (2007), which is incorporated herein by reference.

In accordance with the present invention, adding spin ½ radical molecules to a solution of MEHPPV has shown improvements of the triplet exciton lifetime by about 20%. In these examples, two different polymer blends were used, to which we added TEMPO at various weight ratios with respect to the donor. Different concentrations of TEMPO were added in MEHPPV:PCBM (1:2 concentration) blends. Additional examples were performed with these radicals in blends of P3HT:PCBM (1:1). Each of I-V characterization, frequency dependent polaron photo-induced absorption (PA) measurements, quantum efficiency picosecond Photo-bleaching and impedance spectroscopy measurements were performed to characterize performance of the materials and devices.

Figure 3:
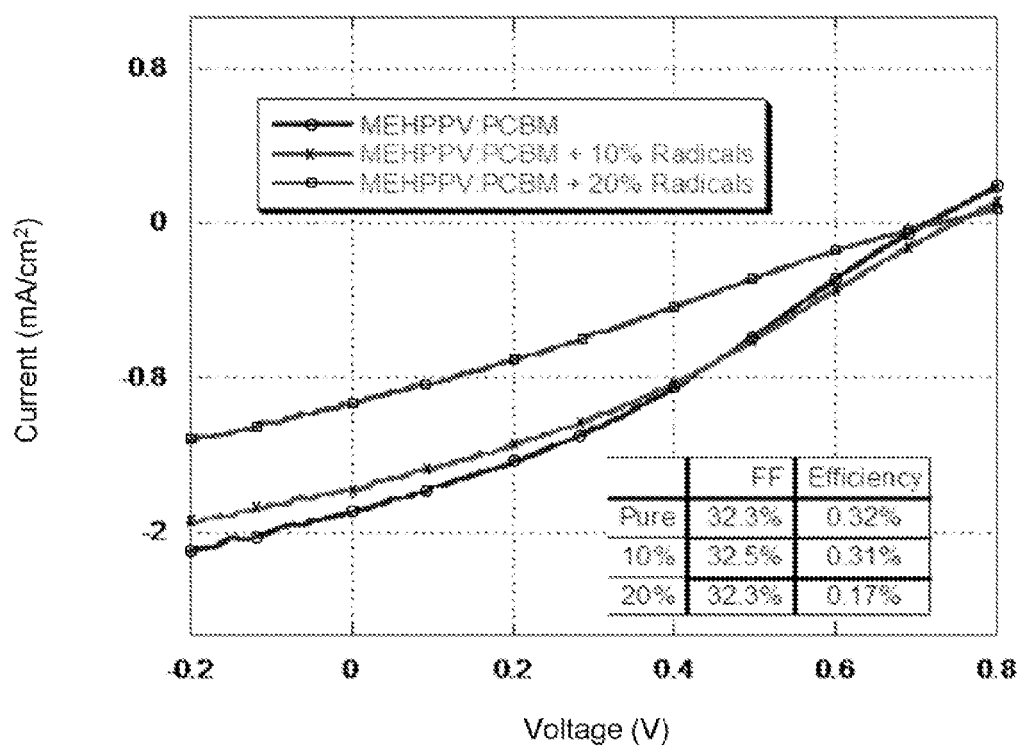
FIG. 3 is a graph of IV-curves device: ITO/PEDOT/MEH-PPV: PCBM+TEMPO (1:2+x %)/Al with x=0%, x=10% and x=20% at AM 1.5 elimination in accordance with one embodiment.
Figure 4:
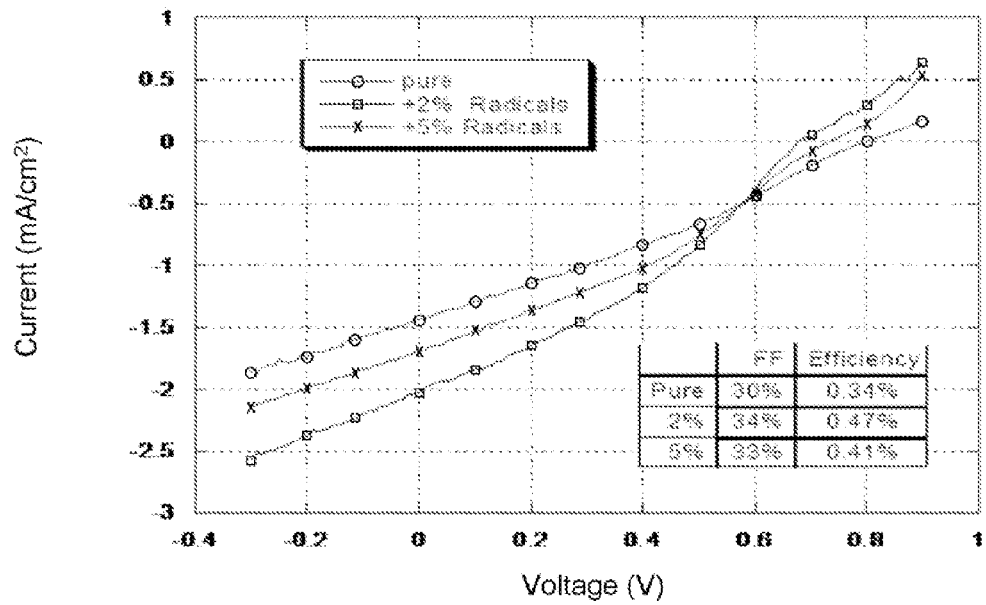
FIG. 4 is a graph of IV-curves device: ITO/PEDOT/MEH-PPV: PCBM+TEMPO (1:2+x %)/Al with x=0%, x=2% and x=5% in accordance with one embodiment.

The addition of 10% and 20% radicals in MEHPPV:PCBM (1:2) blends lead to an increase in efficiency for the larger concentration and an unchanged efficiency for the smaller one (FIG. 3). The fill factor is also unchanged upon addition of radicals as shown in the inset of FIG. 3. Reducing the radical concentration to 2% and 5%, an increase in efficiency was observed for 2% radical with a reduction for 5% (FIG. 4). The fill factor also remains unchanged. While the increase in current and the constant value of the fill factor were repeatable for different batches, the observed decrease in open circuit voltage ($V_{oc}$) was not. The amount of radical added to the system appears to be too small to change the potential profile of the devices. Thus, the increase in efficiency can be attributed solely due to the increase in current. The insert in FIG. 4 summarizes the observed device parameters as a function of the radical concentration.

Figure 5A:
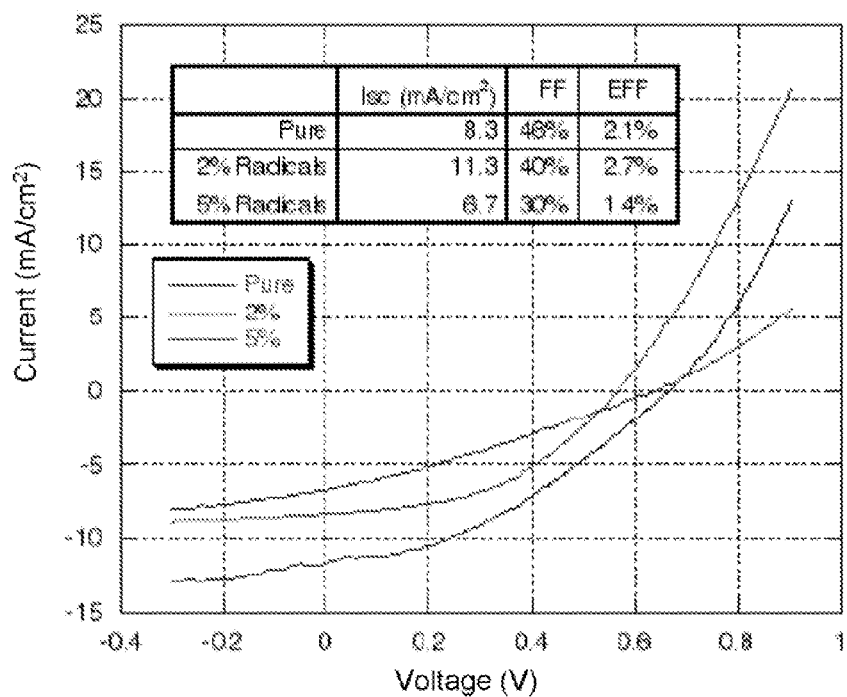
FIGS. 5a and 5b are graphs of an IV-curve device: ITO/PEDOT/P3HT:PCBM+TEMPO (1:1+x %)/Al with x=0%, x=2% and x=5% (a) Batch 1 (b) Batch 2 under AM 1.5 illumination in accordance with one embodiment.
Figure 5B:
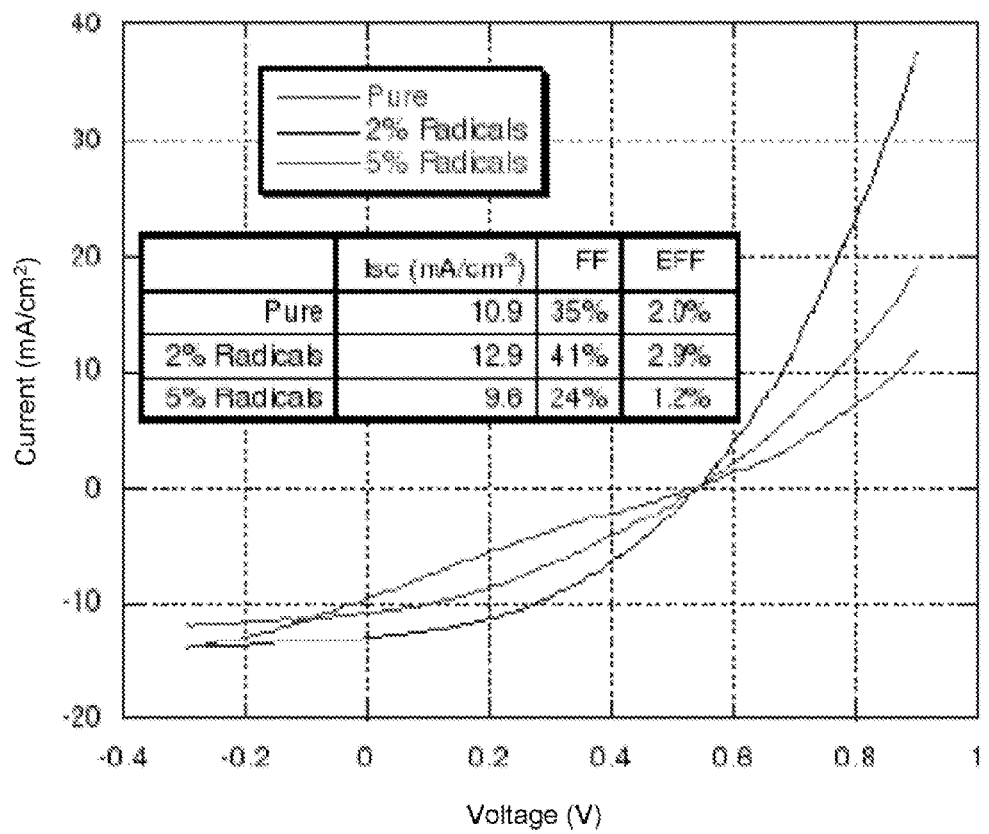

FIGS. 5a and 5b show the IV characteristics of a blend of P3HT:PCBM with various concentrations of radicals. The insert also represents the obtained efficiencies (EFF), fill factors (FF) and current densities ($I_{sc}$). In P3HT:PCBM devices, everything seems to behave the same as in devices with MEH-PPV:PCBM. However, the fill factor seems to increase at 2% before dropping drastically at 5%. The sharp increase in current is responsible for the sharp increase in efficiency. On average, devices from the same fabrication batch show a 20% increase in efficiency for a 2% concentration and a decrease of almost the same amount (14%) for a 5% concentration. With this blend, it was rather difficult to observe any trend in the fill factor as a function of the concentration as shown in FIG. 5. The variation of the $V_{oc}$ and the fill factor are not consistent from device to device. It is therefore assumed that these values remain constant with radical concentration.

For both blends, an increase in efficiency is observed with increasing concentration of radicals. This increase is mainly due to the increase in current. Even though in some cases this increase in efficiency is accompanied by some increase in fill factor, this effect was disregarded, since it is not consistent from device to device. The open voltage circuit does not show any substantial change that can be attributed to the increase of radical concentration. As stated above, the concentrations of radicals used in this study are so low that it is unlikely that they can change the internal electric field profile of the device. While devices fabricated with MEHPPV:PCBM seemed more or less stable from one batch to another in terms of their efficiencies and fill factors, the devices with P3HT:PCBM showed a lot of fluctuations both in terms of open voltage circuit and fill factor. This is mainly due to the fact that, devices based on P3HT have a very regular film, and defects can disrupt the regio-regularity, leading to fluctuating $V_{oc}$'s and fill factor.

Incident photon to current efficiency (IPCE) measurements performed on MEHPPV:PCBM devices with different concentrations of radicals which show only an increase in the magnitude of the photogenerated current. There is no new band created in the spectrum. This implies that there is no change in the absorption of the film with the addition of radicals, and thus no states are created in the gap.

The addition of spin ½ radicals thus enhances the device efficiency. The efficiency enhancement comes primarily from the enhancement of the short circuit current, $I_{sc}$ and fill factor. The photocurrent action spectrum showed no new features except for the enhancement of the efficiency at each wavelength. In the time frame up to 100 ps, there was no change in the charge polaron generation rate. The recombination time of all the photogenerated polarons remained, and the film morphology remained the same. The only parameter that was found to change with radical concentration was an increase in the hole mobility. To explain this change in mobility, we propose a model by which radicals induced both an increase in trap density but also a decrease in spin lattice relaxation time. This decrease in spin lattice relaxation time allows the transit of some carriers that otherwise would have been blocked because of their spin orientation. The enhancement in the mobility comes from the fact that with the addition of radicals, the spin lattice relaxation time is decreased. Thus, blocked carriers can see their spin flip, and, rather than being reflected by the impurity, the blocked carriers are transmitted.

Figure 6:
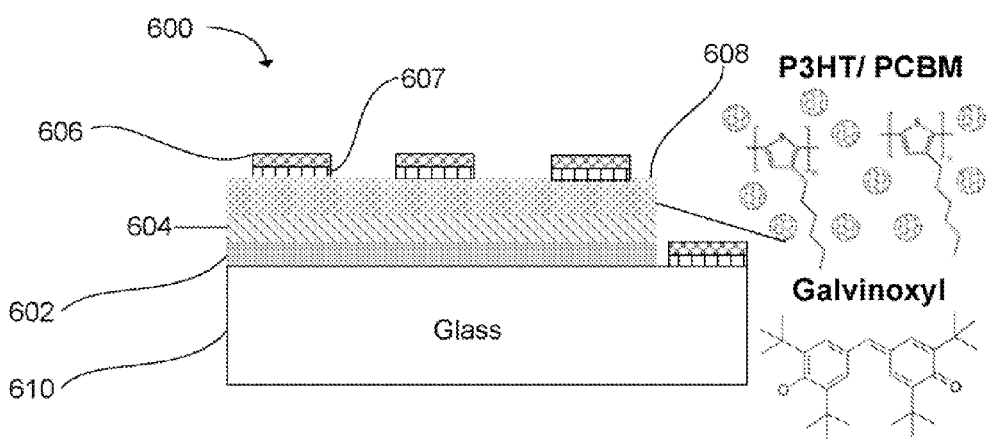
FIG. 6 is a schematic of a bulk heterojunction P3HT/PCBM/galvinoxyl photovoltaic device.

In another example embodiment, a bulk heterojunction organic photovoltaic device (OPV) 600 is comprised of an indium tin oxide (ITO) anode 602, a PEDOT:PSS hole transport layer 604, a single layer of spin-coated RR-P3HT/PCBM blend 608, and a LiF/Al cathode 606 as shown in FIG. 6. The ITO substrate has a low sheet resistance (8-12Ω/□) leading to a small series resistance in the OPV I-V dependence. PEDOT:PSS is a mixture of poly(3,4-ethylenedioxythiophene) and poly(styrenesulfonate), and has a high work function. This creates an ohmic contact that facilitates hole extraction. The PEDOT:PSS layer (40 nm thick) can be spin-coated onto ITO-coated glass in air. In one embodiment, the anode substrate can be subsequently baked at 110° C. for 30 min in a dry nitrogen atmosphere to remove water molecules. The remaining fabrication steps can be carried out in a nitrogen-atmosphere glove box. The RR-P3HT (15 mg/ml)/PCBM solution can be prepared at a 1.2:1 mass ratio in ODCB (ortho-dichlorobenzene). Galvinoxyl radicals can then be dissolved into the solution in the range of 1.5% to 17% mass ratio, defined as the percentage of total P3HT and PCBM mass. The solution can be heated to 50° C. for 5 min and then stirred overnight at room temperature. A 160 nm thick film of P3HT/PCBM blend with added galvinoxyl radicals can be spin-coated onto the PEDOT:PSS layer. After this, the device can be thermally annealed at 150° C. for 3 min. This processing step can significantly improve device performance by facilitating nanoscale phase separation between P3HT and PCBM aggregates. The device fabrication can be completed by thermally evaporating a 1 nm thick film of LiF followed by a 100 nm thick film of Al. The LiF forms an electrical dipole layer 607 at the organic/Al interface, leading to enhanced electron transfer across the interface. Finally the completed device can be encapsulated under a cover glass 610. For example, a Norland 6106 UV-curable optical adhesive can be used to minimize the penetration of water and oxygen into the active layer.

Device I-V characteristics can be measured using a Keithley 236 Source-Measure unit. The light intensity of the solar simulator, composed of a xenon lamp and an AM1.5 filter, can be calibrated to 100 mW/cm$^2$ using a pre-calibrated silicon PV cell. In order to understand the influence of galvinoxyl radical impurities on recombination kinetics in P3HT/PCBM, photoinduced absorption detected magnetic resonance (PADMR) measurements can be carried out. PADMR records the change of photoinduced absorption (PA) induced by resonant microwaves in an external magnetic field. The PADMR signal is proportional to the change in polaron density, which, in turn is due to the change in the polaron pair recombination rate under resonance conditions. An argon laser with a wavelength of 488 nm and a tungsten lamp can be used as pump and probe light sources, respectively. PADMR samples are prepared by drop-casting onto sapphire substrates. The sample film is then placed in a liquid-helium-cooled cryostat at a temperature of 12 K, which slows down the dynamics of polaron and spin-lattice relaxation. 3 GHz microwaves (S-band) that are modulated by a square wave at 200 Hz can be used inside a matched cavity in the cryostat to measure PADMR at various values of the microwave power.

Figure 7:
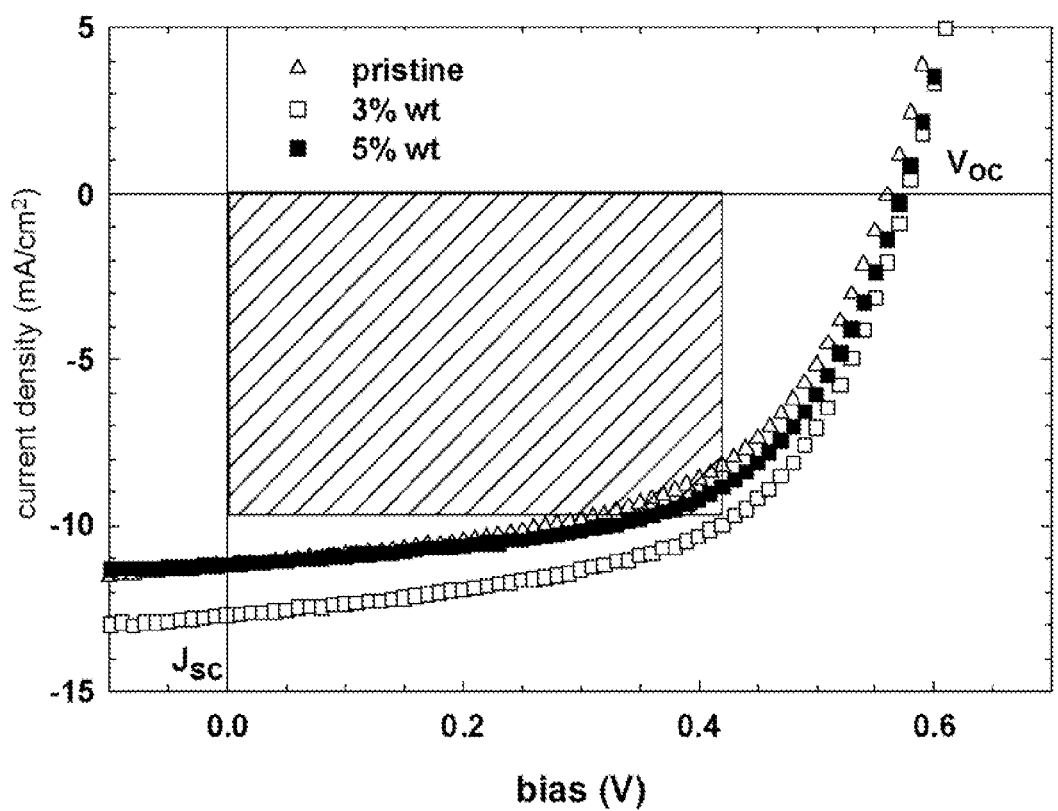
FIG. 7 is a graph of averaged I-V characteristics of devices fabricated from P3HT/PCBM blends in accordance with one embodiment.

FIG. 7 shows averaged I-V characteristics of devices fabricated from P3HT/PCBM blends with three different radical concentrations: pristine, 3% wt and 5% wt. Of these, the 3% wt radical concentration yields the largest power conversion efficiency ($\eta$); $\eta$ of this device is ~20% larger than that of the pristine device. The improvement in $\eta$ can be attributed to two factors: (i) an increase in short-circuit current density ($J_{sc}$), and (ii) an increase in the device fill factor (FF). $J_{sc}$ of the 3% wt devices is improved by ~10% on average, accounting for half of the improvement in n relative to the pristine device. This increase in $J_{sc}$ indicates that carrier generation is enhanced, or carrier recombination is reduced, or both. The remaining ~10% improvement is due to an increase in the device FF, defined as follows:

$$FF = \frac{P_{max}}{J_{sc} \times V_{oc}}, \quad (1)$$

where $P_{max}$ is the maximum possible power output (illustrated by the hatched rectangular area in FIG. 2), and $V_{oc}$ is the open-circuit voltage. The increased FF is consistent with the reduced series resistance that can be directly deduced from the dark I-V curve (not shown), indicating that carrier transport is improved at the 3% wt radical concentration.

Table I summarizes the device properties for all of the investigated radical concentrations (1.5-17 wt %) showing device properties for OPV devices based on P3HT/PCBM blend at various galvinoxyl radical concentrations.

TABLE I

|  | $J_{sc}$ (mA/cm²) | $V_{oc}$ (V) | FF (%) | $\eta$ (%) | No. of Devices |
|---|---|---|---|---|---|
| Pristine | 11.3 ± 0.4 | 0.57 | 55 | 3.46 ± 0.12 | 8 |
| 1.5% wt | 11.9 ± 0.5 | 0.60 | 59 | 4.12 ± 0.17 | 4 |
| 3% wt | 12.7 ± 0.3 | 0.58 | 60 | 4.20 ± 0.10 | 8 |
| 5% wt | 11.2 ± 0.5 | 0.58 | 58 | 3.71 ± 0.17 | 4 |
| 10% wt | 11.2 ± 0.5 | 0.61 | 53 | 3.55 ± 0.16 | 4 |
| 17% wt | 10.5 | 0.65 | 51 | 3.40 | 2 |

Figure 8:
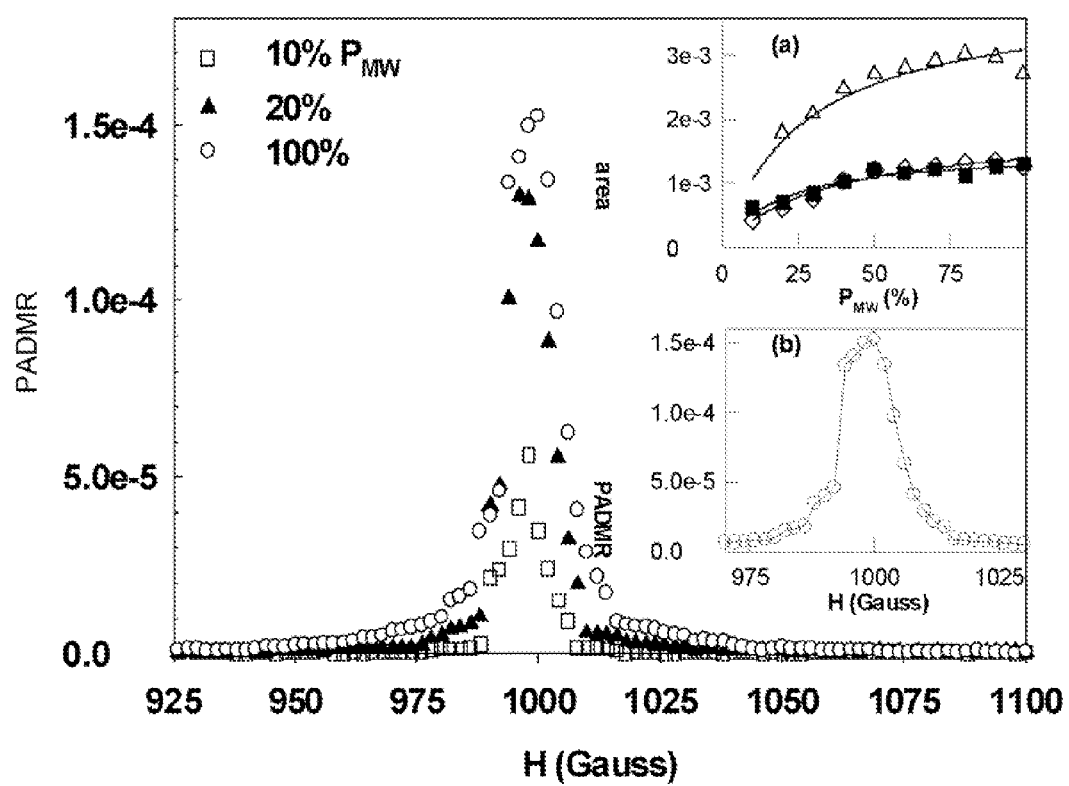
FIG. 8 is a graph showing spin ½ PADMR resonance of a P3HT/PCBM/galvinoxyl (3% wt) device at various microwave powers ($P_{MW}$) in accordance with an embodiment.

The values given are average values obtained from the number of devices indicated in the table for each concentration. The standard deviation is given for $J_{sc}$ and $\eta$ when four or more devices were tested. The improvement in $J_{sc}$, FF and $\eta$ induced by the presence of galvinoxyl radical peaks at ~3% wt, and gradually vanishes with increasing radical concentration. At high concentrations (>10% wt), galvinoxyl begins to suppress the overall performance of the OPV devices. This may be due to the formation of galvinoxyl aggregates at high radical concentrations, where the aggregates are assumed to be detrimental to device performance. We also notice that $V_{oc}$ increases at high galvinoxyl concentration. Because $V_{oc}$ is determined by the energy difference between the LUMO (Lowest Unoccupied Molecular Orbital) level of the fullerene phase and the HOMO (Highest Occupied Molecular Orbital) level of the polymer phase, this increase in $V_{oc}$ may indicate the existence of an additional energy level that is either higher than the fullerene LUMO or lower than the polymer HOMO, and spatially located between the P3HT and PCBM. This picture is consistent with the existence of galvinoxyl aggregates close to the P3HT/PCBM interfaces within the device. The microwave power ($P_{MW}$) dependence of the spin ½ PADMR signal for a 3% wt galvinoxyl device is shown in FIG. 8 as a function of magnetic field. The PADMR resonance increases with $P_{MW}$, eventually saturating at large $P_{MW}$. The integrated PADMR resonance, plotted as a function of $P_{MW}$ as seen in FIG. 8 inset (a), typically exhibits the saturation behavior described by the relation:

$$PADMR \propto \frac{P_{MW}}{\Gamma_{eff} + P_{MW}}, \quad (2)$$

where $\Gamma_{eff}$ is the effective spin-lattice relaxation rate. By fitting data presented in inset (a) using Eq. (2), it is shown that that the $\Gamma_{eff}$ of pristine, 3% wt and 17% wt devices is 1.34× $10^5$, 1.07×$10^5$ and 7.96×$10^4$ s⁻¹, respectively. Thus $\Gamma_{eff}$ decreases with the radical concentration but does not have a minimum at 3% radical as perceived from the device electrical properties. However, the PADMR signal is actually asymmetric about the peak position, as shown in inset (b). The shoulder at 990 Gauss indicates that the spin ½ PADMR resonance in the blend is composed of two different bands. One resonance originates from polarons in PCBM, whereas the other comes from polarons in P3HT. Because the g-factor of spin ½ polarons in PCBM is smaller than that of polarons in P3HT, the resonance band in PCBM appears at a higher magnetic field than that in P3HT. From the asymmetric resonance it can be concluded that the PADMR resonance is mainly due to spin ½ polarons in PCBM, whereas the shoulder at 990 Gauss comes from the polarons in P3HT. Thus if the spin ½ radicals are primarily dispersed in the P3HT phase, then the PADMR caused by radicals will be overwhelmed by the resonance from the PCBM.

The foregoing detailed description describes the invention with reference to specific exemplary embodiments. However, it will be appreciated that various modifications and changes can be made without departing from the scope of the present invention as set forth in the appended claims. The detailed description and accompanying drawings are to be regarded as merely illustrative, rather than as restrictive, and all such modifications or changes, if any, are intended to fall within the scope of the present invention as described and set forth herein.

What is claimed is:

1. An organic spintronic device, comprising:
   a) an organic electron active layer which is a bulk heterojunction including a donor material blended with an acceptor material, said organic electron active layer including a spin active molecular radical distributed in the organic electron active layer which increases spin-lattice relaxation rates within the organic electron active layer, wherein the acceptor material comprises a fullerene and the spin active molecular radical comprises galvinoxyl (2,6-Di-tert-butyl-α-(3,5-di-tert-butyl-4-oxo-2,5-cyclohexadien-1-ylidene)-ptolyloxy)

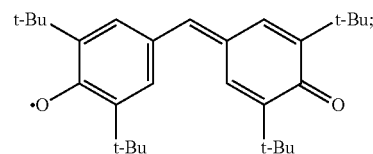

and
   b) a pair of electrodes functionally associated with the organic electron active layer to complete a circuit which transfers electrons via the organic electron active layer.

2. The device of claim 1, wherein the spin active molecular radical distributed in the organic electron active layer induces a spin flip in at least one of a spin ½ electron and a hole to result in a spin triplet state having an increased exciton diffusion length.

3. The device of claim 1, wherein the organic spintronic device is an organic photovoltaic.

4. The device of claim 1, wherein the organic electron active layer is comprised of P3HT/PCBM.

5. The device of claim 1, wherein the spin active molecular radical is a ½ spin molecular radical.

6. The device of claim 1, wherein the spin active molecular radical further comprises:

a) TEMPO (2,2,6,6-Tetramethylpiperidine 1-oxyl)

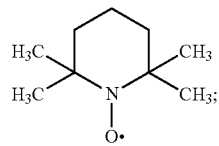

b) 4-Amino-TEMPO

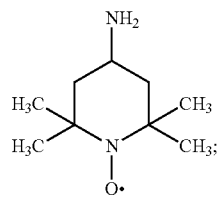

c) 4-Hydroxy-TEMPO benzoate

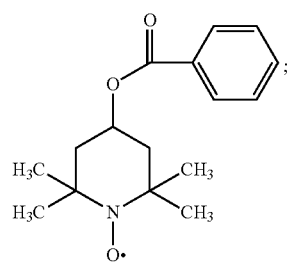

d) 4-[(1-Hydroxy-2,2,6,6-tetramethyl-4-piperidinyl)amino]-4-oxo-2-butenoic acid

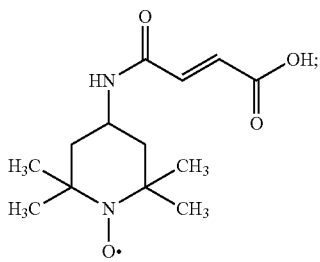

e) 1-Hydroxy-2,2,5,5-tetramethyl-2,5-dihydro-1H-pyrrole-3-carboxylic acid

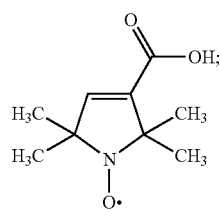

f) 4-Phenyl-2,2,5,5-tetramethyl-3-imidazolin-1-yloxy

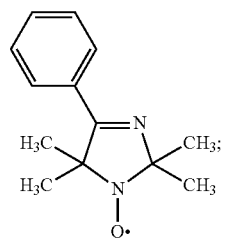

g) 3-(3-(2-IODO-ACETAMIDO)-PROPYL-CARBAMOYL)-PROXYL

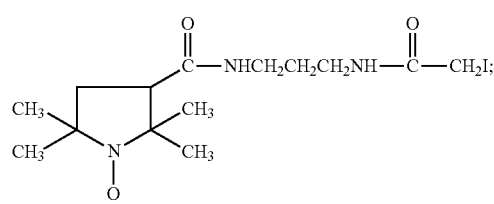

h) BDPA complex with benzene (1:1)

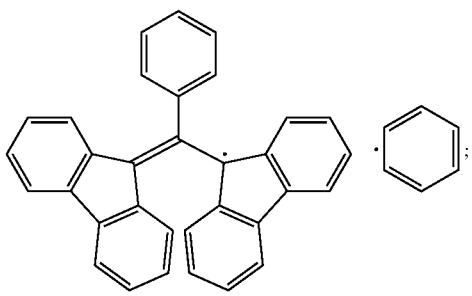

i) N,N-Bis(4-methoxyphenyl)hydroxylamine

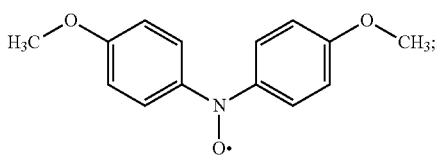

j) Tris(1-hydroxy-2,2,4,6,6-pentamethyl-4-piperidinyl)phosphinetricarboxylate

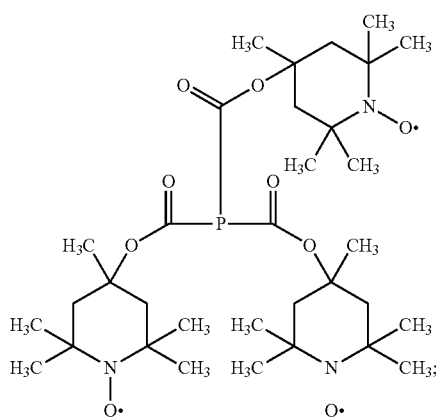

k) Bis(1-hydroxy-2,2,4,6,6-pentamethyl-4-piperidinyl) oxalate

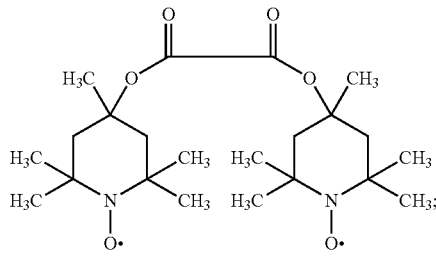

l) Trioctylphosphine oxide (TOPO);

m) M@C60, where M is Gd-157 (stable 3/2 spin nanoparticle); or n) combinations thereof.

7. The device of claim 6, wherein the spin active molecular radical further comprises TEMPO or TOPO.

8. The device of claim 1, wherein the spin active molecular radical is present from 0.1 wt % to about 10 wt % of the organic electron active layer.

9. The device of claim 8, wherein the spin active molecular radical further comprises TEMPO and is present at about 5 wt % of the organic electron active layer.

10. The device of claim 1, wherein the organic electron active layer comprises a donor polymer and an acceptor molecule.

11. The device of claim 10, wherein the donor polymer includes 2-methoxy-5-(2'-ethylhexyloxy)phenylene vinylene polymer (MEHPPV), 1,4-bis[(4-styryl)styryl]-2-methoxy-5-(2'-ethylhexoxy)benzene polymer, poly(2-methoxy,5-(3',7'-dimethyloctyloxy)-1,4-phenylenevinylene (MDMOPPV), poly(2,5-(2-ethylhexyloxy)-1,4-phenylenevinylene) (BEHPPV), or regio regular poly(3-hexylthiophene).

12. The device of claim 10, wherein the acceptor molecule includes fullerene C60, PCBM (soluble C60), modified fullerenes, C70, C84, soluble modified fullerene, or Di-PCBM.

13. The device of claim 1, wherein the pair of electrodes include an indium tin oxide anode.

14. The device of claim 1, wherein the pair of electrodes include a cathode which further includes a conductive metal layer and an electron transport layer, said electron transport layer located between the organic electron active layer and the conductive metal layer.

* * * * *

UNITED STATES PATENT AND TRADEMARK OFFICE
CERTIFICATE OF CORRECTION

| | | |
|---|---|---|
| PATENT NO. | : 8,841,549 B2 | Page 1 of 1 |
| APPLICATION NO. | : 13/123493 | |
| DATED | : September 23, 2014 | |
| INVENTOR(S) | : Zee Valentine Vardeny and Alex Ndobe | |

It is certified that error appears in the above-identified patent and that said Letters Patent is hereby corrected as shown below:

Column 1, line 11, please replace the entire government interest paragraph with the following paragraph.

This invention was made with government support under contract number DE-FG02-04ER46109 awarded by the Department of Energy and grant number DMR0503172 awarded by the National Science Foundation. The government has certain rights in the invention.

Signed and Sealed this
Ninth Day of August, 2016

Michelle K. Lee
*Director of the United States Patent and Trademark Office*